US010204784B1

(12) United States Patent
Gao et al.

(10) Patent No.: US 10,204,784 B1
(45) Date of Patent: Feb. 12, 2019

(54) METHODS OF FORMING FEATURES ON INTEGRATED CIRCUIT PRODUCTS

(71) Applicant: GLOBALFOUNDRIES Inc., Grand Cayman (KY)

(72) Inventors: Jinsheng Gao, Clifton Park, NY (US); Hui Zang, Guilderland, NY (US); Haigou Huang, Rexford, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/797,633

(22) Filed: Oct. 30, 2017

(51) Int. Cl.
| | |
|---|---|
| *H01L 21/033* | (2006.01) |
| *H01L 29/66* | (2006.01) |
| *H01L 21/308* | (2006.01) |
| *H01L 21/8238* | (2006.01) |
| *H01L 27/092* | (2006.01) |

(52) U.S. Cl.
CPC ...... *H01L 21/0338* (2013.01); *H01L 21/0334* (2013.01); *H01L 21/0337* (2013.01); *H01L 21/3083* (2013.01); *H01L 21/3086* (2013.01); *H01L 21/3088* (2013.01); *H01L 21/823821* (2013.01); *H01L 27/0924* (2013.01); *H01L 29/66795* (2013.01)

(58) Field of Classification Search
CPC ............ H01L 21/0338; H01L 21/0334; H01L 21/0337; H01L 21/3086; H01L 21/3083; H01L 21/3088; H01L 27/0924; H01L 21/823821; H01L 29/66795
See application file for complete search history.

(56) References Cited

U.S. PATENT DOCUMENTS

2015/0279684 A1* 10/2015 Wei ................. H01L 21/823431
438/424
2018/0090335 A1* 3/2018 Karve ................. H01L 21/3081

* cited by examiner

*Primary Examiner* — Selim Ahmed
*Assistant Examiner* — Evan Clinton
(74) *Attorney, Agent, or Firm* — Amerson Law Firm, PLLC

(57) ABSTRACT

One illustrative method disclosed herein includes, among other things, forming an initial patterned etch mask above a feature-formation etch mask, the initial patterned etch mask including a plurality of laterally spaced-apart features having a non-uniform spacing, and performing at least one first etching process to remove an entire axial length of at least one of the plurality of features so as to thereby form a modified final patterned etch mask comprised of a plurality of features with a uniform spacing that defines a feature-formation pattern. In this example, the method also includes performing at least one second etching process so as to form a patterned feature-formation etch mask comprising the feature-formation pattern and performing at least one third etching process so as to form a plurality of features in a first layer, the features being formed with the feature-formation pattern.

16 Claims, 6 Drawing Sheets

METHODS OF FORMING FEATURES ON INTEGRATED CIRCUIT PRODUCTS

BACKGROUND OF THE INVENTION

1. Field of the Invention

The present disclosure generally relates to the fabrication of integrated circuits, and, more particularly, to various methods of forming various features on integrated circuit (IC) products.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1 is a perspective view of an illustrative prior art transistor device 10, e.g., a FinFET semiconductor device that is formed above a semiconductor substrate 12 wherein the fins 14 (e.g., features) of the device 10 are made of the material of the substrate 12, e.g., silicon. The device 10 includes a plurality of feature-formation trenches 13, three illustrative features 14, (e.g., fins), a gate structure 16, a sidewall spacer 18 and a gate cap layer 20. An insulating material 17, e.g., silicon dioxide, provides electrical isolation between the fins 14. The gate structure 16 is typically comprised of a layer of insulating material (not separately shown), e.g., a layer of high-k insulating material (k value of at least 10 or greater), and one or more conductive material layers that serve as the gate electrode for the device 10. In this example, the features or fins 14 have a three dimensional configuration: a height H, a width W and an axial length L. The axial length L corresponds to the gate length of the illustrative FinFET device 10, i.e., the direction of current travel in the device 10 when it is operational. The gate width of the device 10 is orthogonal to the gate length direction. The portions of the features or fins 14 (in the depicted embodiment) that are covered by the gate structure 16 are the channel regions of the illustrative FinFET device 10. The portions of the features or fins 14 that are positioned outside of the spacers 18 will become part of the source/drain regions of the device 10.

In many situations, various features of transistor devices are formed in the substrate or on one or more layers of material positioned above the substrate by performing one or more etching processes through a patterned etch mask, e.g., a patterned layer of photoresist material, a patterned hard mask made of a layer of material such as silicon nitride, etc. As device structures or features of an IC product have been reduced in physical size or "scaled" to meet ever increasing packing density, performance and size requirements, the lateral width of some of such features has become very small, and the distance between such features has also been significantly decreased. The formation of physically smaller features and/or more tightly spaced features on an IC product can be very challenging. Moreover, in some cases, after a plurality of features are initially formed for an IC product, some number or portions of those initial features may be removed for various reasons. The removal of such features is typically performed by forming a patterned feature-removal etch mask with an opening that exposes the initial features (or portions thereof) that are desired to be removed while covering the initial features that are desired to be kept. Given the very small spacing between the initial features, in some cases, the positioning of an edge of such a patterned feature-removal etch mask precisely in the middle of two adjacent initial features (one of which will be kept and the other of which will be removed) is very difficult and can lead to problems. For example, if the edge of the patterned feature-removal etch mask is positioned too close to an initial feature that is to be removed, the etching process performed to remove the exposed initial feature may leave undesirable residual materials of the removed initial feature. As another example, if the edge of the patterned feature-removal etch mask is positioned too close to an initial feature that is to be kept, the etching process performed to remove the exposed initial feature may inadvertently remove at least a portion of the initial feature that is desired to be kept.

The present disclosure is directed to various methods of forming various features on IC products that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming various features on IC products. One illustrative method disclosed herein includes, among other things, forming an initial patterned etch mask above a feature-formation etch mask, the initial patterned etch mask including a plurality of laterally spaced-apart features having a non-uniform spacing, and performing at least one first etching process to remove an entire axial length of at least one of the plurality of features so as to thereby form a modified final patterned etch mask that defines a feature-formation pattern, wherein the modified final patterned etch mask is comprised of a plurality of features with a uniform spacing. In this example, the method also includes performing at least one second etching process through the modified final patterned etch mask so as to form a patterned feature-formation etch mask comprising the feature-formation pattern and performing at least one third etching process through at least the patterned feature-formation etch mask so as to form a plurality of features in a first layer, the features being formed in accordance with the feature-formation pattern.

BRIEF DESCRIPTION OF THE DRAWINGS

The disclosure may be understood by reference to the following description taken in conjunction with the accompanying drawings, in which like reference numerals identify like elements, and in which.

Figure 1:
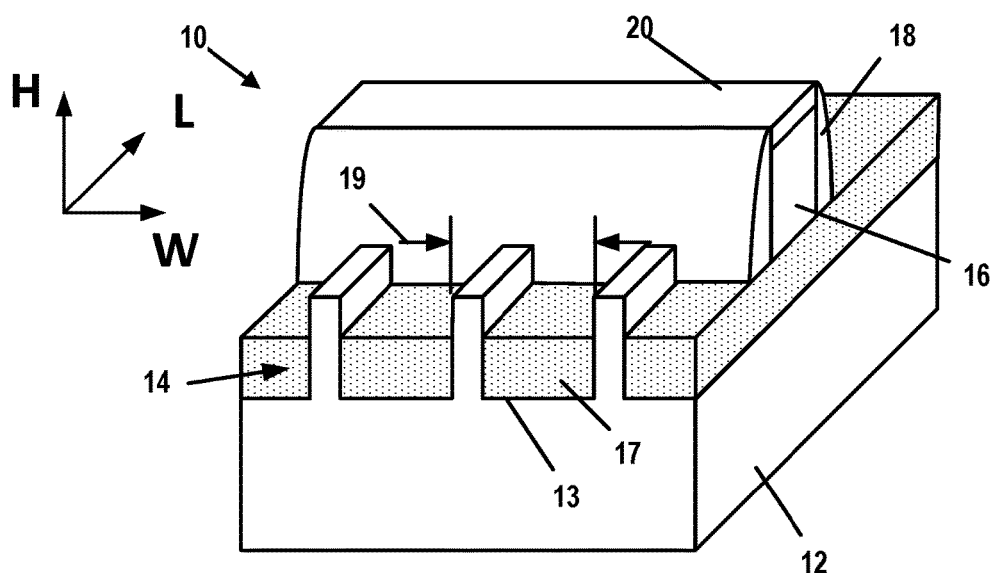
FIG. 1 is a simplistic depiction of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming various features on IC products. As will be readily apparent to those skilled in the art upon a complete reading of the present application, the present method is applicable to the formation of a variety of different features on a variety of different products, including, but not limited to, logic products, memory products, etc. With reference to the attached figures, various illustrative embodiments of the methods and devices disclosed herein will now be described in more detail, wherein the illustrative features formed by performing the methods disclosed herein are fins for a FinFET device. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etching, etc. The thicknesses of these various layers of material may also vary depending upon the particular application.

FIGS. 2-12 depict various novel methods disclosed herein for forming various features on an IC product 100. As will be appreciated by those skilled in the art after a complete reading of the present application, the methods disclosed herein may be employed to form a variety of different features on an IC product. Moreover, the methods disclosed herein may be employed to form such features in any layer of material including, but not limited to, a bulk semiconductor substrate, any portion of an SOI substrate, such as the active layer or the buried insulation layer of the SOI substrate, a layer of material formed above the bulk semiconductor substrate or above the SOI substrate, etc. As used in the attached claims, the term "first layer" shall be understood to mean any of the foregoing wherein any type of feature of an IC product may be formed. The features formed using the method disclosed herein may have any desired configuration, and they may be formed as any part or feature of the IC product 100. In the illustrative example depicted herein, the illustrative features formed using the methods disclosed herein will be a plurality of fins 122 that are formed in a bulk semiconductor substrate 102, i.e., the substrate 102 is "first layer" in the example depicted herein (see FIG. 11). Of course, the features may take other forms, such as patterned trenches or structures defined in any type of layer of material positioned above the substrate, various conductive lines formed in the metallization system of an IC product, etc. Thus, the presently disclosed inventions should not be considered to be limited to the formation of any particular type of feature or to features having any particular configuration, function or purpose as it relates to the structure, function and operation of an IC product.

Figure 2:
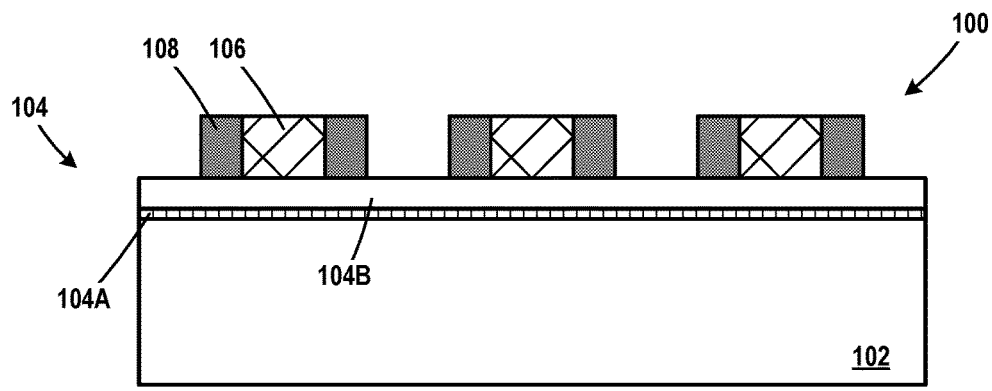
FIGS. 2-12 depict various novel methods disclosed herein for forming various features on IC products.

FIG. 2 depicts an illustrative IC product 100 after several processing steps were performed. First, the materials for a feature-formation etch mask 104 were formed above a semiconductor substrate 102 (i.e., the substrate 102 is the "first layer" in the example depicted herein). In the depicted example, the feature-formation etch mask 104 is comprised of two layers of material: a layer of silicon dioxide 104A and a layer of silicon nitride 104B. The feature-formation etch mask 104 will ultimately be patterned by forming a patterned etch mask above the feature-formation etch mask 104 using various unique sidewall image transfer and etching techniques as disclosed herein. Accordingly, FIG. 2 depicts the product after a first sidewall image transfer process was performed to form a plurality of first mandrels 106 above the feature-formation etch mask 104 and after a plurality of simplistically-depicted first sidewall spacers 108 were formed adjacent the first mandrels 106. The first mandrels 106 were formed by depositing a layer of mandrel material (e.g., silicon dioxide) and thereafter patterning the layer of mandrel material by performing an etching process through a patterned etch mask (not shown), e.g., a patterned layer of photoresist. The first sidewall spacers 108 were formed by performing a conformal deposition process to form a conformal layer of first spacer material above and between the first mandrels 106. Thereafter, an anisotropic etching process was performed to remove the horizontally positioned portions of the layer of first spacer material, thereby leaving a first spacer 108 positioned on opposite sidewalls of each of the first mandrels 106. The first sidewall spacers 108 may be made of any desired material but they should be made of a material that may be selectively etched relative to the material of the first mandrels 106. For example, in the case where the first mandrels 106 are made of silicon dioxide, the first sidewall spacers 108 may be made of amorphous silicon. The lateral thickness (or width) of the first sidewall spacers 108 (at their base) may vary depending upon the particular application.

In the examples depicted herein, the substrate 102 has a bulk semiconducting material (e.g., silicon) configuration. The substrate 102 may also have a semiconductor-on-insulator (SOI) configuration that includes a bulk semiconductor layer, a buried insulation layer positioned on the bulk semiconductor layer and an active layer positioned on the buried insulation layer, wherein fins for FinFET devices will be formed in the active layer. The substrate 102 may be made of silicon or it may be made of semiconductor materials other than silicon. Thus, the terms "substrate" or "semiconductor substrate" should be understood to cover all semiconducting materials and all forms of such materials. The feature-formation etch mask 104 is intended to be representative in nature as it may be comprised of a variety of materials, such as, for example, silicon nitride, silicon oxynitride, silicon dioxide, etc. Moreover, the feature-formation etch mask 104 may be comprised of multiple layers of material, such as, for example, the depicted silicon dioxide layer 104A and the silicon nitride layer 104B. Thus, the particular form and composition of the feature-formation etch mask 104 should not be considered a limitation of the presently disclosed inventions.

Figure 3:
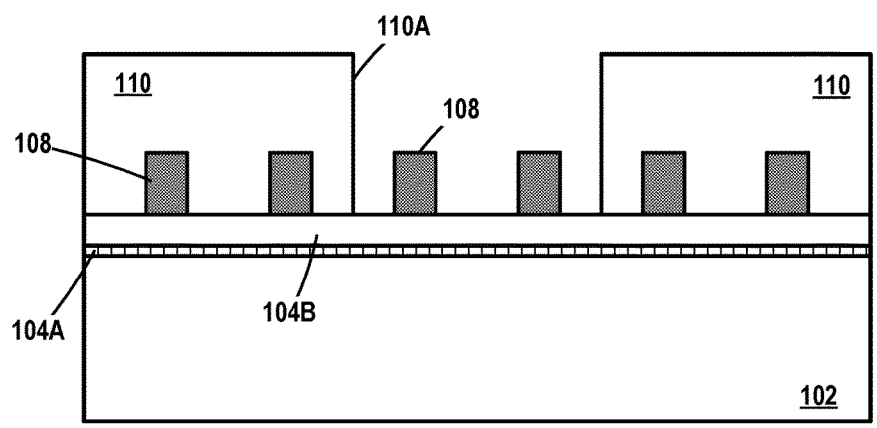

FIG. 3 depicts the product 100 after several process operations were performed. First, the last step of the first sidewall image transfer process was performed—a mandrel etching process—to selectively remove the first mandrels 106 relative to the first sidewall spacers 108, thereby leaving six, laterally spaced-apart, illustrative first sidewall spacers 108 in position above the feature-formation etch mask 104. At this point, all of the first sidewall spacers 108 have a substantially uniform lateral width and they have a substantially uniform lateral spacing between the first sidewall spacers 108 across the substrate. Then, a first patterned etch mask 110, e.g., a patterned layer of photoresist, with a first opening 110A formed therein, was formed on the product 100. As depicted, the first opening 110A exposes the middle two first sidewall spacers 108 for further processing while masking the remaining first sidewall spacers 108. Of course, depending upon the particular application, only one, or more than two, such first sidewall spacers 108 may be exposed by the first opening 110A, i.e., the first opening 110A may be sized and configured so as to expose any number of the desired first sidewall spacers 108. In one illustrative embodiment, the first opening 110A is sized such that it exposes the entire axial length (that extend into and out of the plane of the drawings) of the first sidewall spacers 108.

Figure 4:
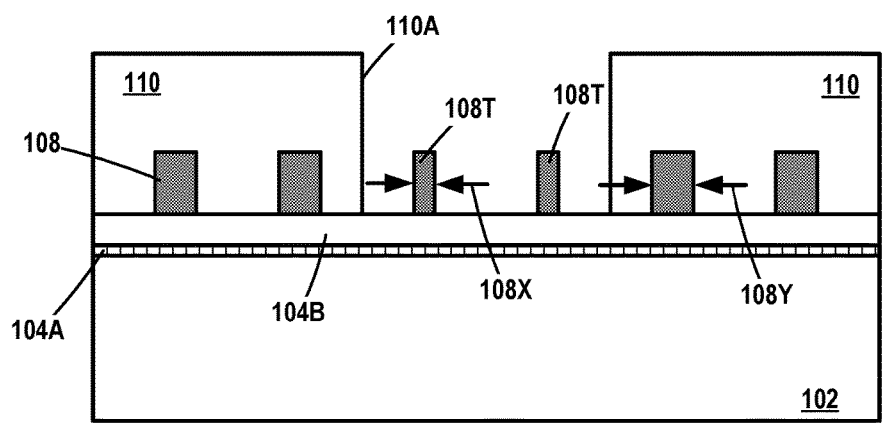

FIG. 4 depicts the product after one or more first spacer trimming etch processes, e.g., an anisotropic or isotropic etching process, was performed through the first patterned etch mask 110 to reduce the lateral width of the exposed first sidewall spacers 108, i.e., to trim the exposed portions of the first sidewall spacers 108. More specifically, the process operation results in the formation of a plurality of laterally trimmed first sidewall spacers 108T having a lateral width 108X that is less than a lateral width 108Y of the remaining un-trimmed first sidewall spacers 108 that were covered by the first patterned etch mask 110 during the etching process. Note that, for simplicity, any reduction in the vertical height of the trimmed first sidewall spacers 108T is not depicted in the drawings. The amount of trimming or thinning of the trimmed first sidewall spacers 108T relative to the un-trimmed first sidewall spacers 108 may vary depending upon the particular application. For example, in some applications, the lateral width 108X of the trimmed first sidewall spacers 108T may be about 50-75% less than the lateral width 108Y of the un-trimmed first sidewall spacers 108. In some applications, the lateral width 108Y of the un-trimmed first sidewall spacers 108 may be on the order of about 20 nm. Note that, due to the formation of the trimmed first sidewall spacers 108T, the un-trimmed first sidewall spacers 108 and the trimmed first sidewall spacers 108T, considered collectively, no longer have a uniform lateral spacing across the substrate 102.

Figure 5:
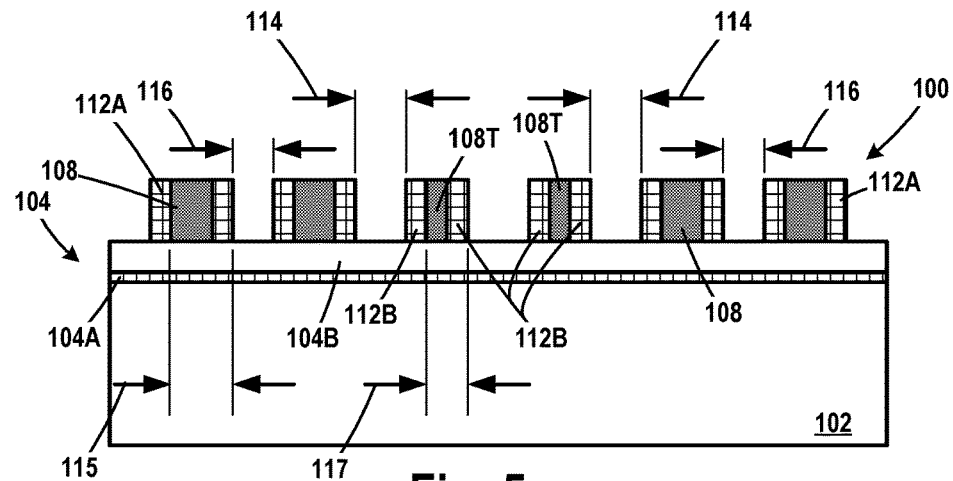

As shown in FIG. 5, at this point in the illustrative process flow depicted herein, a second sidewall image transfer process was performed to form a plurality of second sidewall spacers 112A, 112B (the reference numeral 112 will be used to refer to both of the second sidewall spacers 112A and 112B). More specifically, during this second sidewall image transfer process, the un-trimmed first sidewall spacers 108 and the trimmed first sidewall spacers 108T function as mandrel structures for the formation of the plurality of second sidewall spacers 112 that are positioned adjacent the un-trimmed first sidewall spacers 108 and the trimmed first sidewall spacers 108T. For reference purposes, the second sidewall spacers 112 formed adjacent the un-trimmed first sidewall spacers 108 will be identified with the reference numeral 112A, while the second sidewall spacers 112 formed adjacent the trimmed first sidewall spacers 108T will be identified by the reference numeral 112B. The spacers 112A and 112B are all made of the same material and they all have the same width (at their base). Prior to formation of the second sidewall spacers 112, the first patterned spacer trim etch mask 110 was removed. Thereafter, the second sidewall spacers 112 were formed by performing a conformal deposition process to form a conformal layer of second spacer material above and between the un-trimmed first sidewall spacers 108 and the trimmed first sidewall spacers 108T. Then, an anisotropic etching process was performed to remove the horizontally positioned portions of the layer of second spacer material, thereby leaving a second sidewall spacer 112A positioned on each of the opposite sidewalls of each of the un-trimmed first sidewall spacers 108, and a second sidewall spacer 112B positioned on each of the opposite sidewalls of each of the trimmed first sidewall spacers 108T. The second sidewall spacers 112 may be made of any desired material but they should be made of a material that may be selectively etched relative to the material of the un-trimmed first sidewall spacers 108 and the trimmed first sidewall spacers 108T. For example, in the case where the first sidewall spacers 108 are made of amorphous silicon, the second sidewall spacers 112 may be made of silicon dioxide. The lateral thickness (or width) of the second sidewall spacers 112 (at their base) may vary depending upon the particular application. Note that, due to the reduced lateral width 108X (see FIG. 4) of the trimmed first sidewall spacers 108T, the lateral spacing 114 between a second sidewall spacer 112B formed on a trimmed first sidewall spacer 108T and a second sidewall spacer 112A formed on an adjacent un-trimmed first sidewall spacer 108 is greater than the lateral spacing 116 between the adjacent second sidewall spacers 112A formed on the opposing sidewalls of the un-trimmed first sidewall spacers 108. The magnitude of the dimensions 114 and 116 may vary depending upon the particular application. Also note that, due to the smaller lateral width 108X of the trimmed first sidewall spacers 108T, the lateral spacing between the second sidewall spacers 112B formed on a single trimmed first sidewall spacer 108T will be less than the lateral spacing between the second sidewall spacers 112A formed on a single wider, un-trimmed first sidewall spacer 108. Additionally, the pitch 115 between adjacent second sidewall spacers 112A is greater than the pitch 117 between adjacent second sidewall spacers 112B.

Figure 6:
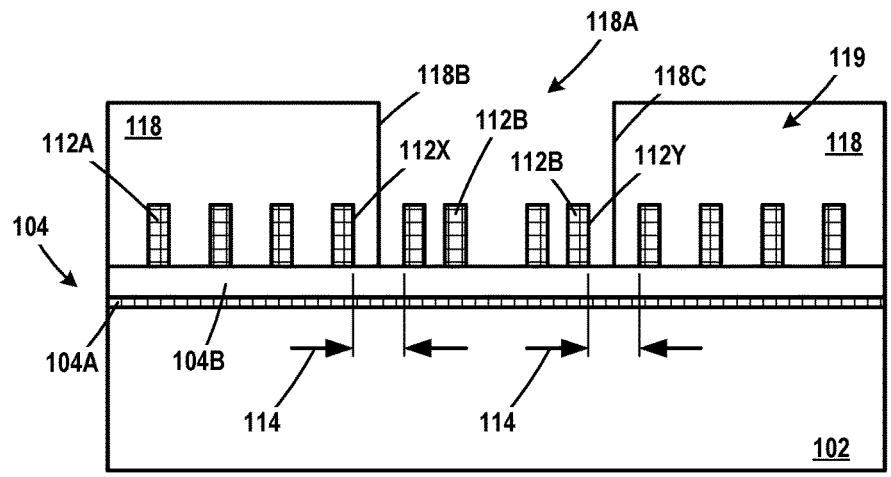

FIG. 6 depicts the IC product 100 after several process operations were performed. First, the last step of the second sidewall image transfer process was performed—a mandrel etching process—to selectively remove the un-trimmed first sidewall spacers 108 and the trimmed first sidewall spacers 108T relative to the second sidewall spacers 112, thereby leaving twelve illustrative second sidewall spacers 112 (eight of the second sidewall spacers 112A and four of the second sidewall spacers 112B) in position above the feature-formation etch mask 104. The twelve illustrative spacers 112 constitute an initial patterned etch mask 119 that comprises a plurality of laterally spaced-apart features, i.e., the collection of the spacers 112A (first mask features) and 112B (second mask features), with a non-uniform spacing between the laterally spaced-apart features. Then, a second patterned feature-removal etch mask 118, e.g., a patterned layer of photoresist, with a second opening 118A formed therein was formed on the product 100. In one example, the second patterned feature-removal etch mask 118 may have the same pattern as that of the first patterned etch mask 110, i.e., the second opening 118A may be sized and configured so as to expose the entire axial length (into and out of the plane of the drawing page) of the four second sidewall spacers 112B for further processing. Note that the second patterned feature-removal etch mask 118 protects the remaining second sidewall spacers 112A.

With continuing reference to FIG. 6, due to the processing described above, i.e., the formation of the trimmed first sidewall spacers 108T, the lateral width 114 between adjacent spacers 112A (first mask features) and 112B (second mask features) is greater than it would be had the spacer trimming process not been performed. More specifically, had the trimmed first sidewall spacers 108T not have been formed, there would have been a uniform (and smaller) lateral spacing 116 (see FIG. 5) between all of the second sidewall spacers 112A. In effect, the larger lateral spacing 114 provides more room in which the edges 118B, 118C of the second patterned feature-removal etch mask 118 may be positioned between adjacent spacers 112A and 112B, i.e., the methods disclosed herein provide a larger process window for the formation of the second patterned feature-removal etch mask 118. For example, the increased lateral spacing 114 permits the edge 118B of the second opening 118A to be positioned a sufficient distance away from the edge 112X of the adjacent second sidewall spacer 112A (a first mask feature), thereby preventing or decreasing the likelihood of undesirable removal of a feature that will correspond to the second sidewall spacer 112A when the features are ultimately formed in the substrate 102. Similarly, the increased lateral spacing 114 permits the edge 118C of the second opening 118A to be positioned a sufficient distance away from the edge 112Y of the adjacent second sidewall spacer 112B (a second mask feature), thereby preventing or decreasing the likelihood of undesirable residue from incomplete removal of some of the features when the features are ultimately formed in the substrate 102.

Figure 7:
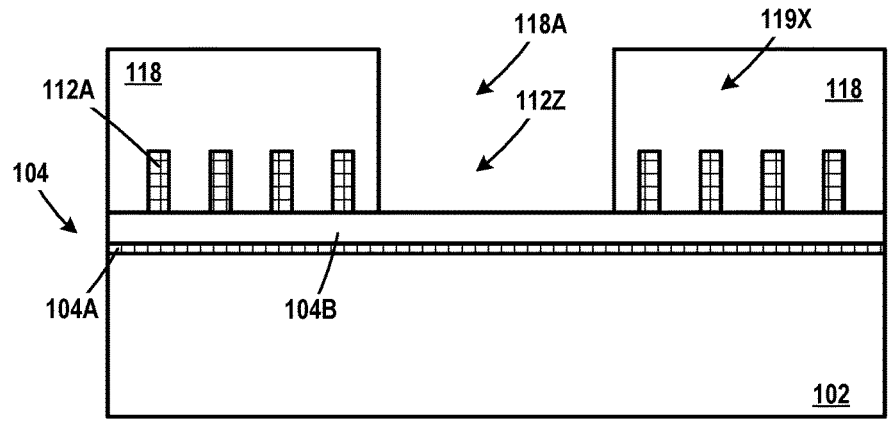

FIG. 7 depicts the product 100 after an etching process was performed through the second patterned feature-removal etch mask 118 to remove the exposed second sidewall spacers 112B (second mask features). This process operation effectively removes the entirety of the second sidewall spacers 112B and forms a third opening 112Z in the initial patterned etch mask 119. That is, the collection of the remaining second sidewall spacers 112A constitutes a modified final patterned etch mask 119X that is comprised of a plurality of final features with a uniform spacing between the remaining final features (ignoring the third opening 112Z of course). The modified final patterned etch mask 119X will be used to pattern the underlying feature-formation etch mask 104. The final features in the modified final patterned etch mask 119X defines a feature-formation pattern that will ultimately be used when forming the features on the IC product 100, as described more fully below.

Figure 8:
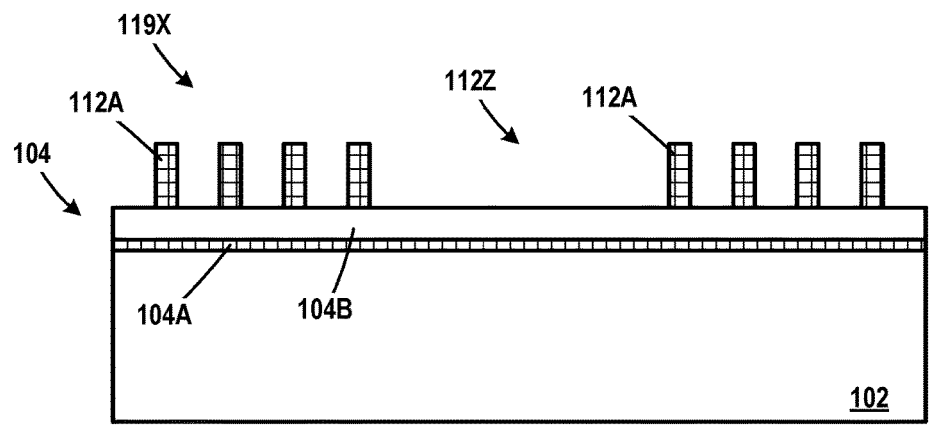
Figure 9:
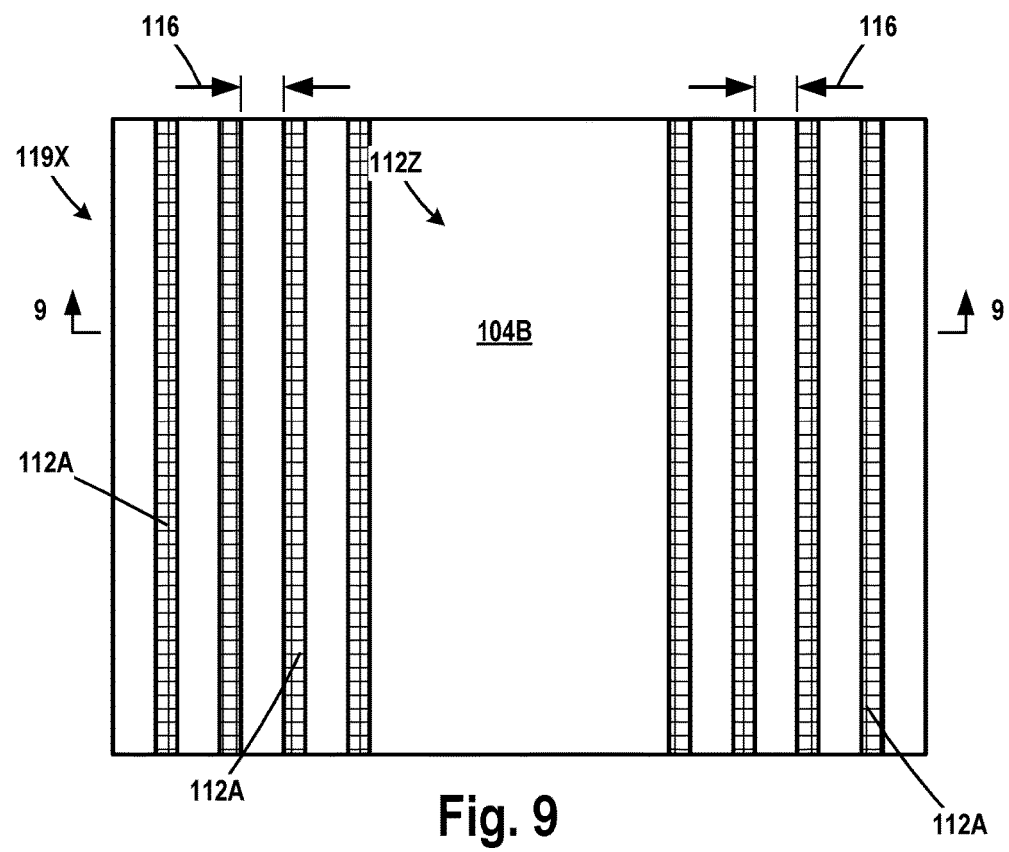

FIG. 8 (cross-sectional view) and FIG. 9 (plan view) depict the IC product 100 after the second patterned feature-removal etch mask 118 was removed, thereby leaving the modified final patterned etch mask 119X in position above the feature-formation etch mask 104. FIG. 9 is a simplistic example showing the formation of the modified final patterned etch mask 119X wherein substantially the entire axial length of the second sidewall spacers 112B (second mask features) were removed, i.e., the modified final patterned etch mask 119X is only comprised of the second sidewall spacers 112A (i.e., the final features) with a uniform lateral spacing 116 between adjacent second sidewall spacers 112A.

Figure 10:
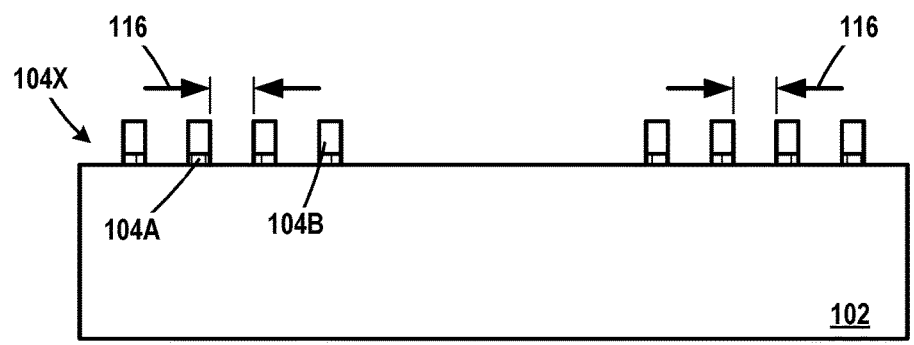

FIG. 10 depicts the product 100 after several process operations were performed. First, one or more etching processes, e.g., anisotropic etching processes, were performed through the modified final patterned etch mask 119X to remove some or all of the materials of the feature-formation etch mask 104 and thereby form a patterned feature-formation etch mask 104X that has a pattern corresponding to the feature-formation pattern present in the modified final patterned etch mask 119X. The modified final patterned etch mask 119X may or may not remain in position throughout all of the etching process(es) performed to pattern the feature-formation etch mask 104. FIG. 10 depicts the product after the modified final patterned etch mask 119X was removed.

Figure 11:
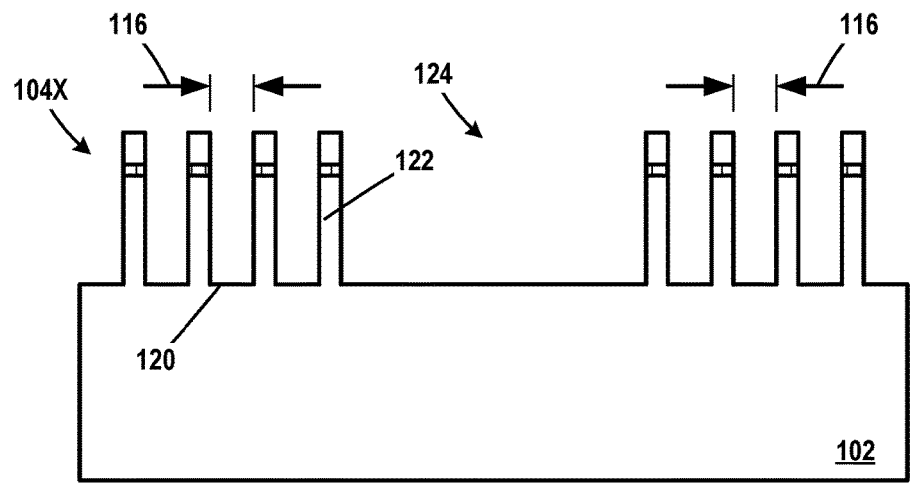

FIG. 11 (cross-sectional view) depicts the product 100 after one or more etching processes, e.g., anisotropic etching processes, were performed through the patterned feature-formation etch mask 104X to form a plurality of feature-formation trenches 120 in the substrate 102 and thereby form a plurality of features 122. As noted above, in the example disclosed herein, the features 122 are fins for a plurality of FinFET devices that will be formed on the IC product 100. However, it should be understood that the inventions disclosed herein are not limited to the formation of such fin features for IC products. Due to the removal of the second sidewall spacers 112B, these etching processes also result in the formation of an illustrative open space 124 in the otherwise "sea of features" (e.g., a "sea of fins")

formed across the substrate 102 in the particular example depicted herein. That is, by removing the second sidewall spacers 112B so as to form the third opening 112Z in the modified final patterned etch mask 119X (see FIGS. 7-9), the features 122 (e.g., fins) are not formed in the area corresponding to the location of the third opening 112Z in the modified final patterned etch mask 119X. The width and height of the features 122 may vary depending upon the particular application. Additionally, the overall size, shape and configuration of the feature-formation trenches 120 and the features 122 may vary depending on the particular application. In the illustrative examples depicted in the attached drawings, the feature-formation trenches 120 and the features 122 are all depicted as having a uniform size and shape. However, such uniformity in the size and shape of the trenches 120 and the features 122 may not be not required to practice at least some aspects of the inventions disclosed herein. In the attached figures, the feature-formation trenches 120 are depicted as having been formed by performing an anisotropic etching process that results in the features 122 having a simplistically depicted, generally rectangular configuration. In an actual real-world product, the sidewalls of the features 122 may be somewhat outwardly tapered (i.e., the features 122 may be wider at the bottom of the feature 122 than they are at the top of the feature 122), although that configuration is not depicted in the attached drawings. Thus, the size and configuration of the feature-formation trenches 120 and the features 122, and the manner in which they are made, should not be considered a limitation of the presently disclosed inventions. For ease of disclosure, only the substantially rectangular trenches 120 and features 122 are depicted in the drawings.

Figure 12:
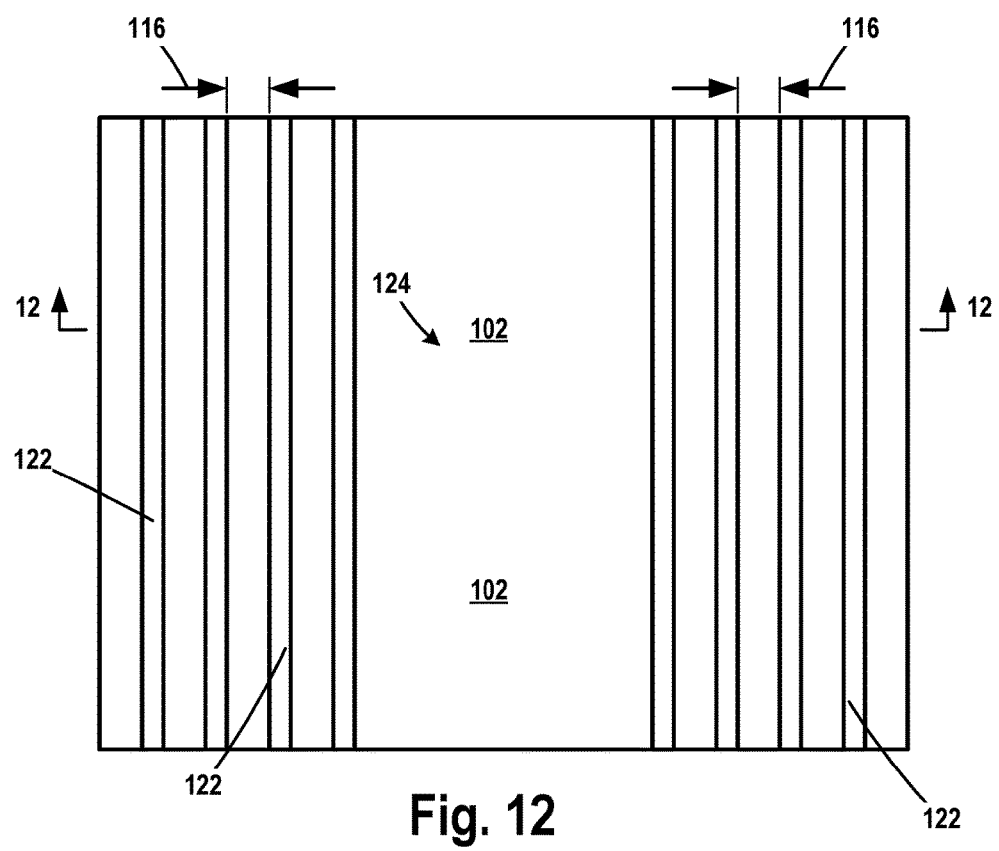

FIG. 12 (plan view) depicts the IC product 100 after the patterned feature-formation etch mask 104X was removed. As shown, a plurality of features 122 (e.g., fins) were formed in the substrate 102 with the opening 124 depicted therein. As shown in FIG. 12, the features 122 are formed with the feature-formation pattern set or established by the arrangement and positioning of the features in the modified final patterned etch mask 119X. At the point of processing depicted in FIG. 12, traditional manufacturing operations may be performed to complete the fabrication of an integrated circuit product comprised of a plurality of FinFET transistor devices (not shown).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method, comprising:
   forming a feature-formation etch mask above a first layer;
   forming an initial patterned etch mask above said feature-formation etch mask, said initial patterned etch mask comprising a plurality of laterally spaced-apart features with a non-uniform spacing between said laterally spaced-apart features, wherein all of said plurality of laterally spaced-apart features are formed during same steps of a second sidewall image transfer process;
   performing at least one first etching process to remove an entire axial length of at least one of said plurality of laterally spaced-apart features of said initial patterned etch mask so as to thereby form a modified final patterned etch mask comprised of a plurality of final features that define a feature-formation pattern;
   performing at least one second etching process through said modified final patterned etch mask on said feature-formation etch mask so as to form a patterned feature-formation etch mask comprising said feature-formation pattern; and
   performing at least one third etching process through at least said patterned feature-formation etch mask so as to form a plurality of features in said first layer, said plurality of features being formed in accordance with said feature-formation pattern.

2. The method of claim 1, wherein said first layer comprises one of a bulk semiconductor substrate, a portion of an SOI substrate, a layer of material positioned above a bulk semiconductor substrate or a layer of material positioned above an SOI substrate.

3. The method of claim 1, wherein said first layer is a bulk semiconductor substrate and said plurality of features are a plurality of fins for a plurality of FinFET devices, wherein said plurality of fins are formed in accordance with said feature-formation pattern.

4. The method of claim 1, wherein said plurality of features comprise one of a plurality of fins for a plurality of FinFET devices, a plurality of trenches formed in a layer of material or a plurality of conductive lines.

5. The method of claim 1, wherein forming said feature-formation etch mask comprises:
   forming a layer comprising silicon dioxide on a surface of said first layer; and
   forming a layer comprising silicon nitride on said layer comprising silicon dioxide.

6. The method of claim 1, wherein, prior to performing said at least one first etching process, the method comprises forming a second patterned etch mask above at least some of said plurality of laterally spaced-apart features of said initial patterned etch mask, wherein said second patterned etch mask comprises an opening that exposes the entire axial length of said at least one of said plurality of features, and wherein said at least one first etching process is performed though said opening in said second patterned etch mask.

7. The method of claim 1, wherein said plurality of laterally spaced-apart features of said initial patterned etch mask comprise a plurality of second sidewall spacers that were formed by:
   forming a plurality of laterally spaced-apart first sidewall spacers above said feature-formation etch mask by performing a first sidewall image transfer process, each of said first sidewall spacers having a first lateral width;
   forming a patterned trimming etch mask above said feature-formation etch mask, said patterned trimming etch mask comprising an opening that exposes an entire axial length of at least one of said first sidewall spacers;
   performing at least one trimming etching process on said exposed at least one first sidewall spacer so as to define at least one trimmed first sidewall spacer, wherein said at least one trimmed first sidewall spacer has a second lateral width that is less than said first lateral width;
removing said patterned trimming etch mask; and
forming said plurality of laterally spaced-apart second sidewall spacers by performing said second sidewall image transfer process, wherein said plurality of first sidewall spacers and said at least one trimmed first sidewall spacer serve as mandrel structures during said second sidewall image transfer process.

8. The method of claim 1, wherein said plurality of laterally spaced-apart features of said initial patterned etch mask comprise a plurality of laterally spaced-apart first mask features and at least one second mask feature, wherein a first lateral spacing between adjacent laterally spaced-apart first mask features is less than a second lateral spacing between said at least one second mask feature and a laterally adjacent one of said first mask features.

9. The method of claim 8, wherein, prior to performing said at least one first etching process, the method comprises forming a patterned etch mask above said plurality of laterally spaced-apart first features of said initial patterned etch mask, wherein an edge of said patterned etch mask is positioned within said second lateral spacing and wherein said patterned etch mask comprises an opening that exposes an entire axial length of said at least one second mask feature, and wherein said at least one first etching process is performed though said opening in said patterned etch mask.

10. A method, comprising:
forming a feature-formation etch mask above a first layer;
forming an initial patterned etch mask above said feature-formation etch mask, said initial patterned etch mask comprising a plurality of laterally spaced-apart first mask features that are laterally adjacent each other and at least one second mask feature that is laterally spaced apart from an adjacent one of said first mask features, wherein a first lateral spacing between said laterally spaced-apart adjacent first mask features is less than a second lateral spacing between said at least one second mask feature and said laterally adjacent one of said first mask features, and wherein said plurality of laterally spaced-apart first mask features and said at least one second mask feature are all formed from a same material during same processing steps;
performing at least one first etching process to remove an entire axial length of said at least one second mask feature while masking at least said plurality of first mask features so as to form a modified final patterned etch mask comprising said plurality of first mask features that defines a feature-formation pattern;
performing at least one second etching process through said modified final patterned etch mask on said feature-formation etch mask so as to form a patterned feature-formation etch mask comprising said feature-formation pattern; and
performing at least one third etching process through at least said patterned feature-formation etch mask so as to form a plurality of features in said first layer, said features being formed in accordance with said feature-formation pattern.

11. The method of claim 10, wherein forming said initial patterned etch mask above said feature-formation etch mask comprises:
forming a plurality of first mandrel structures above said feature-formation etch mask;
forming first sidewall spacers adjacent opposite sidewalls of each of said first mandrel structures, each of said first sidewall spacers having a first lateral width;
performing a first mandrel etching process to selectively remove said plurality of first mandrel structures and leave said plurality of first sidewall spacers in position above said feature-formation etch mask;
forming a patterned trimming etch mask above said feature-formation etch mask, said patterned trimming etch mask comprising an opening that exposes an entire axial length of at least one first sidewall spacer;
performing at least one trimming etching process on said exposed at least one first sidewall spacer so as to define at least one trimmed first sidewall spacer, wherein said at least one trimmed first sidewall spacer has a second lateral width that is less than said first lateral width;
removing said patterned trimming etch mask;
forming a plurality of said first mask features adjacent opposite sidewalls of each of said plurality of first sidewall spacers and a plurality of said second mask features adjacent opposite sidewalls of said at least one trimmed first sidewall spacer; and
performing an etching process to selectively remove said plurality of first sidewall spacers and said at least one trimmed first sidewall spacer and leave said plurality of first mask features and said at least one second mask feature in position above said feature-formation etch mask.

12. The method of claim 10, wherein said first layer is a bulk semiconductor substrate and said plurality of features are a plurality of fins for a plurality of FinFET devices, wherein said plurality of fins are formed in accordance with said feature-formation pattern.

13. A method, comprising:
forming a feature-formation etch mask above a first layer;
forming an initial patterned etch mask above said feature-formation etch mask by:
forming a plurality of spaced-apart first sidewall spacers, each of said first sidewall spacers having a first lateral width;
trimming at least one of said first sidewall spacers to form at least one trimmed first sidewall spacer having a second lateral width that is less than said first lateral width;
forming a plurality of second sidewall spacers adjacent opposite sidewalls of each of said first sidewall spacers and adjacent opposite sidewalls of said at least one trimmed first sidewall spacer; and
removing said first sidewall spacers and said at least one trimmed first sidewall spacer so as to form said initial patterned etch mask comprised of said plurality of second sidewall spacers, wherein there is a non-uniform spacing between said plurality of second sidewall spacers;
performing at least one first etching process to remove an entire axial length of at least one of said second sidewall spacers so as to form a modified final patterned etch mask comprised of a plurality of said second sidewall spacers with a uniform spacing that defines a feature-formation pattern;
performing at least one second etching process through said modified final patterned etch mask on said feature-formation etch mask so as to form a patterned feature-formation etch mask comprising said feature-formation pattern; and
performing at least one third etching process through at least said patterned feature-formation etch mask so as to form a plurality of features in said first layer, said features being formed in accordance with said feature-formation pattern.

14. The method of claim 13, wherein, prior to performing said at least one first etching process, the method comprises forming an etch mask above at least some of said plurality of second sidewall spacers, wherein said etch mask comprises an opening that exposes the entire axial length of said at least one of said second sidewall spacers, and wherein said at least one first etching process is performed though said opening in said etch mask.

15. The method of claim 13, wherein said first layer is a bulk semiconductor substrate and said plurality of features are a plurality of fins for a plurality of FinFET devices, wherein said plurality of fins are formed in accordance with said feature-formation pattern.

16. The method of claim 1, wherein all of said plurality of laterally spaced-apart features are formed from a same material.

* * * * *